United States Patent
Chang

(10) Patent No.: US 7,733,985 B2
(45) Date of Patent: Jun. 8, 2010

(54) PHASE-LOCKED LOOP CIRCUIT WITH A MIXED MODE LOOP FILTER

(75) Inventor: Chih-Chiang Chang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 973 days.

(21) Appl. No.: 11/354,764

(22) Filed: Feb. 14, 2006

(65) Prior Publication Data

US 2007/0189430 A1 Aug. 16, 2007

(51) Int. Cl.
*H03D 3/24* (2006.01)
*H03D 3/18* (2006.01)

(52) U.S. Cl. ...................................... 375/327
(58) Field of Classification Search ................. 375/327; 331/16
See application file for complete search history.

(56) References Cited

U.S. PATENT DOCUMENTS

| | | | |
|---|---|---|---|
| 5,978,425 A | 11/1999 | Takla | |
| 6,864,753 B2 | 3/2005 | Lee et al. | 331/17 |
| 2004/0201428 A1* | 10/2004 | Kenney et al. | 331/16 |
| 2005/0062550 A1 | 3/2005 | Melanson | |
| 2005/0237120 A1* | 10/2005 | Park | 331/16 |

FOREIGN PATENT DOCUMENTS

TW 095133032 2/2006

OTHER PUBLICATIONS

Lee, Tai-Cheng and Razavi, Behzad, "A Stabilization Technique for Phase-Locked Frequency Synthesizers", IEEE Journal of Solid-State Circuits, (Jun. 2003) vol. 38, No. 6, pp. 888-894.

* cited by examiner

*Primary Examiner*—David C Payne
*Assistant Examiner*—Tanmay K Shah
(74) *Attorney, Agent, or Firm*—K&L Gates LLP

(57) ABSTRACT

A phase-locked loop circuit includes a phase and frequency detector receiving a reference signal and an output signal of the phase-locked loop circuit for generating a detected signal representing a frequency or phase difference therebetween. A digital charge pump coupled to the phase and frequency detector generates a charge control signal in response to the detected signal. A mixed mode loop filter coupled to the digital charge pump filters the charge control signal and generates an oscillation control signal. A voltage controlled oscillator is coupled to the mixed mode loop filter for generating the output signal of the phase-locked loop circuit by adjusting its oscillation frequency in response to the oscillation control signal. The mixed mode loop filter has both digital and analog characteristics in carrying out filtering the charge control signal, thereby reducing a layout area for the same to be implemented on a semiconductor substrate.

10 Claims, 5 Drawing Sheets

PHASE-LOCKED LOOP CIRCUIT WITH A MIXED MODE LOOP FILTER

BACKGROUND

The present invention relates generally to integrated circuit (IC) designs, and more particularly to a phase-locked loop (PLL) circuit with a mixed mode filter for reducing the implementation area of the PLL circuit.

PLL circuits are commonly used in circuits that generate a high-frequency signal with a frequency being an accurate multiple of the frequency of a reference signal. PLL circuits can also be found in applications where the phase of the output signal has to track the phase of the reference signal, hence the name phase-locked loop. For example, the PLL circuit can be used in a radio receiver or transmitter for generating a local oscillator signal, which is a multiple of a stable, low-noise and often temperature-compensated reference signal. As another example, the PLL circuit can also be used for clock recovery applications in digital communication systems, disk-drive read-channels, etc.

A conventional PLL circuit typically includes a phase and frequency detector, a charge pump, a loop filter, a voltage control oscillator and a feedback divider. The loop filter can be either analog or digital. The analog loop filter can be a passive filter composed of inductors, capacitors, and resistors, or an active filter composed of resistors, capacitors, and amplifiers. The digital loop filter is composed of building blocks, such as adders, delay units, and multipliers.

The analog loop filter combines a resistor in series with a capacitor. The stability of the analog PLL circuit is proportional to the values of the resistor and capacitor. Conventionally, the value of capacitor is set approximately from 100 pF to 300 pF in order to avoid instability. The large capacitor causes the PLL circuit to be large in size.

The digital loop filter combines a digital amplifier, adder and delay unit, and is realizable in a smaller area compared to the analog loop filter. However, a digital-to-analog converter requires an interface with the analog voltage control oscillator. The area of digital-to-analog converter is small at low resolutions and large at high resolutions. In order to obtain a high accuracy, the digital-to-analog converter for the PLL circuit needs to have a high resolution (10~14 bits). Thus, the area occupied by the digital PLL circuit is large due to the high resolution digital-to-analog converter, in spite of the small area occupied by the digital loop filter.

As such, it is desirable to have a PLL circuit that provides high accuracy and occupies minimum areas.

SUMMARY

The present invention discloses a phase-locked loop circuit, which includes a phase and frequency detector receiving a reference signal and an output signal of the phase-locked loop circuit for generating a detected signal representing a difference between the reference signal and the output signal in frequency or phase. A digital charge pump is coupled to the phase and frequency detector for generating a charge control signal in response to the detected signal. A mixed mode loop filter is coupled to the digital charge pump for filtering the charge control signal and generating an oscillation control signal. A voltage controlled oscillator is coupled to the mixed mode loop filter for generating the output signal of the phase-locked loop circuit by adjusting its oscillation frequency in response to the oscillation control signal. The mixed mode loop filter has both digital and analog characteristics in carrying out filtering the charge control signal, thereby reducing a layout area for the same to be implemented on a semiconductor substrate.

The construction and method of operation of the invention, however, together with additional objectives and advantages thereof will be best understood from the following description of specific embodiments when read in connection with the accompanying drawings.

DESCRIPTION

Figure 1A:
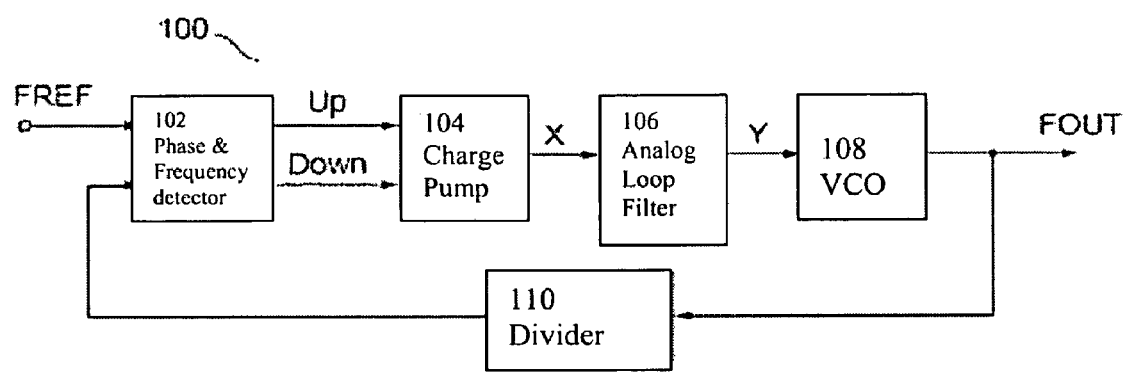
FIGS. 1A and 1B illustrate a conventional analog PLL circuit.

FIG. 1A illustrates a conventional analog PLL circuit 100. The phase and frequency detector 102 receives two inputs, a reference frequency signal FREF and an oscillating output signal FOUT from the feedback loop. The phase and frequency detector 102 serves as an "error amplifier" in the feedback loop for minimizing the phase difference, $\Delta\phi$, between FREF and FOUT. The phase and frequency detector 102 produces a sequence of UP or DOWN pulses to switch the charge pump 104 for charging or discharging a capacitor, as determined by the phase and frequency detector 102. An analog loop filter 106 is used to limit the rate of change of capacitor voltage, thereby generating a slowly rising or falling voltage that depends on the frequency difference between FREF and FOUT. The voltage controlled oscillator 108 receives signals from the analog loop filter 106, and increases or decreases its frequency of operation as the signals output from the analog loop filter 106 increase or decrease. The feedback divider 110 in the feedback loop provides an option to increase the frequency of FOUT by a predetermined ratio. The characteristics of the charge pump 104, the analog loop filter 106 and the voltage-controlled oscillator 108 determine the phase and frequency response of the analog PLL circuit 100.

Figure 1B:
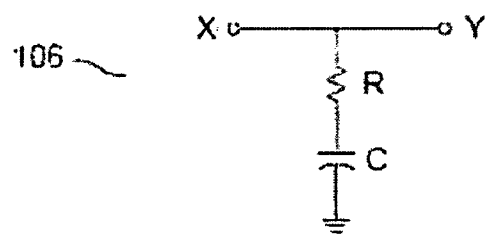

FIG. 1B schematically illustrates the analog loop filter 106, which combines a resistor R in series with a capacitor C. The transfer function for the analog loop filter 106 in the S-domain can be described as follows:

$$T(S)_{loop\_filter} = \frac{Y}{X} = \frac{1+SCR}{SC} \quad (1)$$

where X represents the signal at node x, Y represents the signal at node y, C represents the capacitance of capacitor C, and R represents the resistance of resistor R. In order to improve the stability of analog loop filter 106, it is desirable to increase the capacitance of the capacitor C. Conventionally, the capacitance of capacitor C ranges from 100 pF to 300 pF in order to avoid instability. This causes the capacitor C to be large in size. This, in turn, causes the conventional analog PLL circuit to be inefficient in layout area when it is implemented on a semiconductor substrate.

Figure 2A:
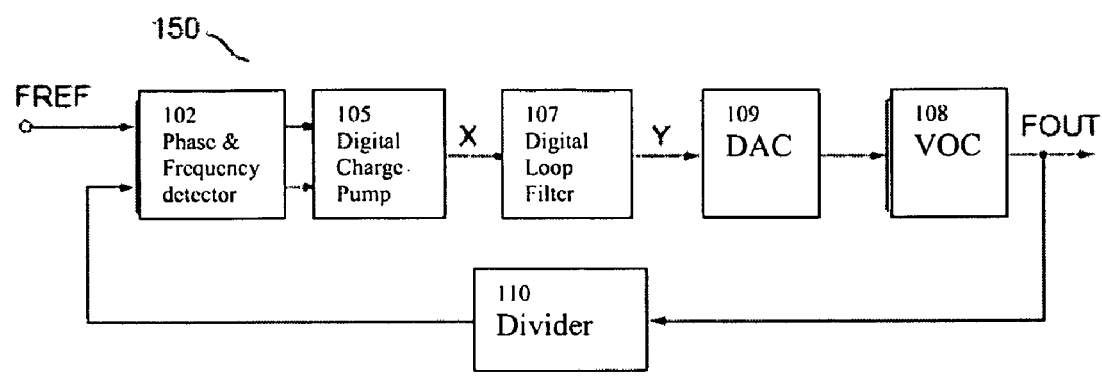
FIGS. 2A and 2B illustrate a conventional digital PLL circuit.

FIG. 2A illustrates a conventional digital PLL circuit 150. The phase and frequency detector 102 receives two inputs, a reference frequency signal FREF and an oscillating output signal FOUT from the feedback loop. The phase and frequency detector 102 produces a sequence of UP or DOWN pulses to switch the digital charge pump 105. A digital loop filter 107 is connected to the output of the digital charge pump 105. A digital-to-analog converter 109 interfaces the digital loop filter 107 to the voltage controlled oscillator 108. The voltage-controlled oscillator 108 increases or decreases its frequency of operation as the control voltage at its input increases or decreases. The feedback divider 110 in the feedback loop provides an option to increase FOUT by a predetermined ratio. The characteristics of the charge pump 105, the digital loop filter 107, the digital-to-analog converter 109, and the voltage controlled oscillator 108 determine the phase and frequency response of the digital PLL circuit 150.

Figure 2B:
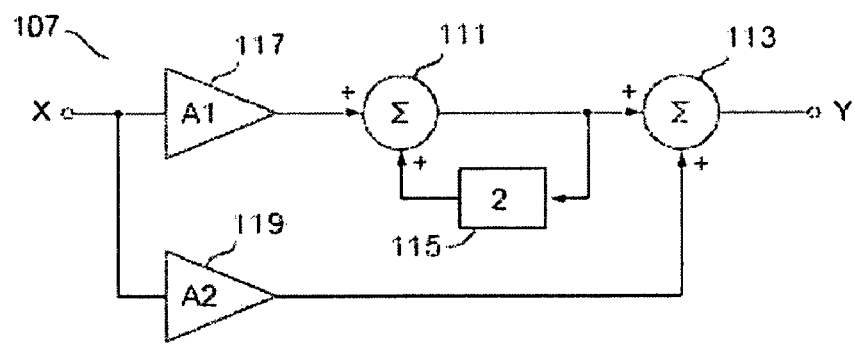

FIG. 2B schematically illustrates the digital loop filter 107, which combines one or more digital amplifiers 117 and 119 with gains A1 and A2, respectively, one or more adders 111 and 113, and a multiplier 115, which multiplies the output from the adder 111 by $Z^{-1}$. The transfer function for the digital loop filter 107 in the Z-domain is derived as follows:

$$T(Z)_{loop\_filter} = \frac{X}{Y} = \frac{A1}{1 - Z^{-1}} + A2 \quad (2)$$

where X represents the signal at node x, and Y represents the signal at node y.

The digital loop filter 107 does not need to be large in order to avoid system instability, so that is can be made in a small area. However, in order to accurately convert the digital outputs of the digital loop filter 107, the digital-to-analog converter 109 needs to be in high resolution. The higher the resolution, the larger the area occupied by the digital-to-analog converter 109. Conventionally, the digital-to-analog converter 109 needs to have a resolution between 10 and 14 bits in order to obtain a good accuracy. This results in a large digital-to-analog converter 109, and therefore causes the digital PLL circuit 150 shown in FIG. 2A to be inefficient in layout area when it is implemented on a semiconductor substrate.

Figure 3:
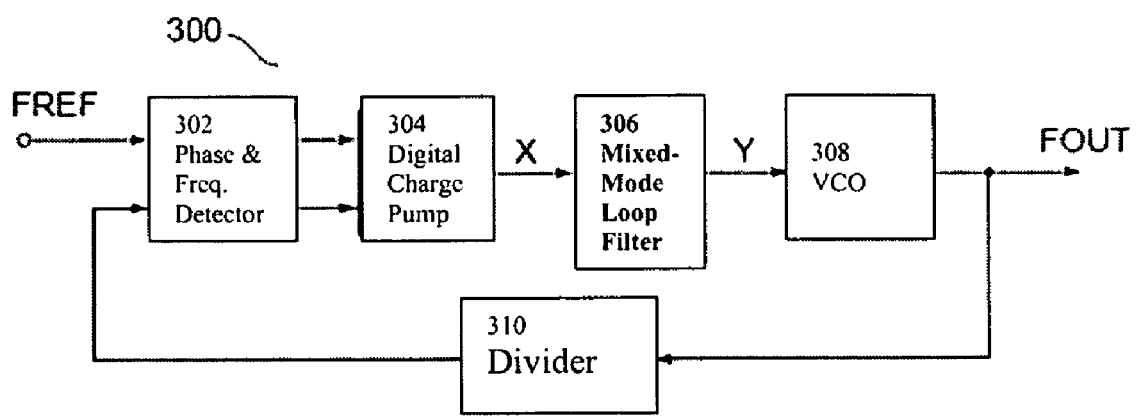
FIG. 3 illustrates a PLL circuit with a mixed mode loop filter in accordance with one embodiment of the present invention.

FIG. 3 illustrates the architecture of the proposed PLL circuit 300 with a mixed mode loop filter 306 in accordance with one embodiment of the present invention. The PLL circuit 300 includes a phase and frequency detector 302, a digital charge pump 304, a mixed mode loop filter 306, a voltage controlled oscillator 308 and a feedback divider 310. The phase and frequency detector 302 receives two inputs, a reference frequency signal FREF and an oscillating output signal FOUT from the feedback loop. The phase and frequency detector 302 produces a sequence of UP or DOWN pulses to switch the digital charge pump 304. The mixed mode loop filter 306 is connected to the output of the digital charge pump 304, and outputs analog signals to the voltage controlled oscillator 308. The voltage-controlled oscillator 308 increases or decreases its frequency of operation as the control voltage at its input increases or decreases. The feedback divider 310 in the feedback loop provides an option to increase FOUT by a predetermined ratio. The characteristics of the charge pump 302, the mixed mode loop filter 306, and the voltage controlled oscillator 308 determine the phase and frequency response of the PLL circuit 300.

Figure 4:
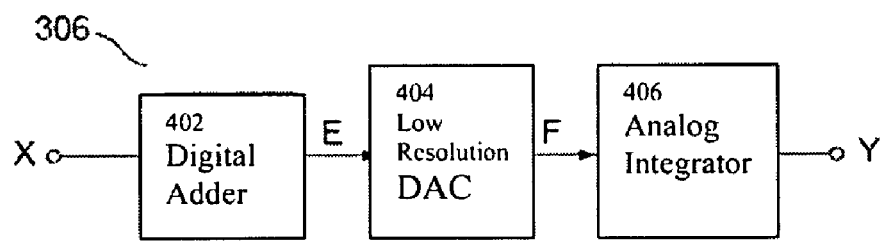
FIG. 4 illustrates a block diagram of the mixed mode loop filter in accordance with one embodiment of the present invention.

FIG. 4 illustrates a block diagram of the mixed mode loop filter 306 in accordance with one embodiment of the present invention. The mixed mode loop filter 306 includes a digital adder 402, an analog integrator 406, and a digital-to-analog converter circuit 404 that interfaces therebetween. The transfer function of the mixed mode loop filter 306 in the Z-domain can be described by equation (2). The following equations can be derived therefrom.

$$T(Z)_{loop\_filter} = \frac{X}{Y} = \frac{(A1 + A2) - A2 \times Z^{-1}}{1 - Z^{-1}} \quad (3)$$

$$T(Z)_{loop\_filter} = \frac{X}{Y} = \frac{(A1 + A2) - A2 \times Z^{-1}}{1} \times \frac{1}{1 - Z^{-1}} \quad (4)$$

$$T(Z, S)_{loop\_filter} = \frac{X}{Y} = \frac{(A1 + A2) - A2 \times Z^{-1}}{1} \times \frac{1}{S} \quad (5)$$

The digital adder 402 realizes the first part of the equation, $(A1+A2)-A2 \times Z^{-1}$, and the analog integrator 406 realizes second part of the equation, 1/S. The conversion from digital-to-analog is accomplished by the digital-to-analog converter 404. Since the transfer function is realized using both digital and analog circuits, it is named mixed mode loop filter 306.

Figure 5:
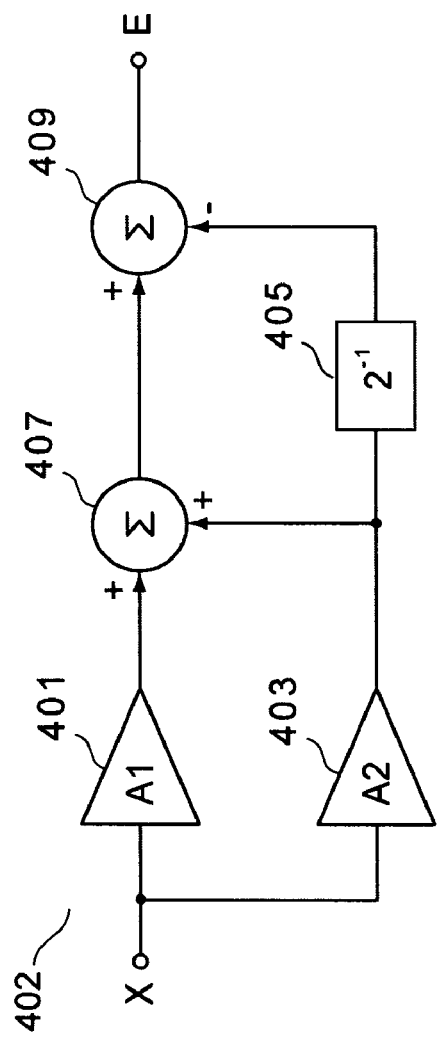
FIG. 5 illustrates a digital adder for the mixed mode loop filter in accordance with one embodiment of the present invention.

FIG. 5 schematically illustrates the digital adder 402 in detail in accordance with one embodiment of the present invention. The digital adder 402 includes two digital amplifiers 401 and 403 with gains A1 and A2, respectively, coupled a node x for receiving the output from the digital charge pump 304 shown in FIG. 3. The outputs of the digital amplifiers 401 and 403 are added together by the adder 407, and then the summation is output to the adder 409, which also receives an output from a multiplier 405, which multiplies the output from the amplifier 403 by $Z^{-1}$. The adder 409 then subtracts the output of the multiplier 405 from the output of the adder 407, and generates an output to a node E. The adder 402 is digital in nature and can be made small in size.

Figure 6:
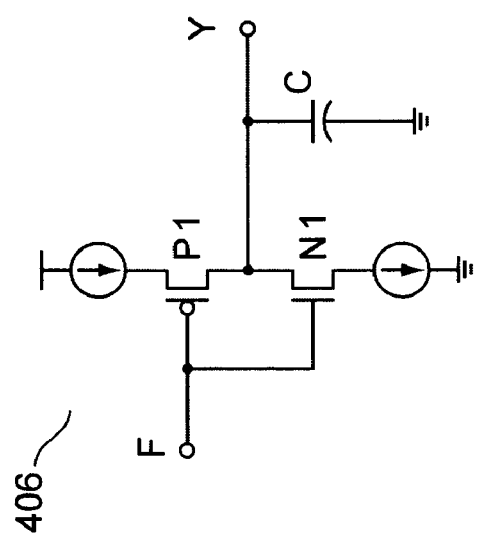
FIG. 6 illustrates an analog integrator for the mixed mode loop filter in accordance with one embodiment of the present invention.

FIG. 6 schematically illustrates the analog integrator 406 in detail in accordance with one embodiment of the present invention. The analog integrator 406 includes a switch device with a PMOS transistor P1 and an NMOS transistor N1. The sources of the PMOS and NMOS transistors P1 and N1 are coupled to current sources, respectively. The gates of the transistors P1 and N1 receive the input from the digital-to-analog converter 404 (shown in FIG. 4), and their drains are connected together to an output node y. A capacitor C is connected between the output node y and ground. The pulse width of the output of the digital-to-analog converter 404 controls the time for charging or discharging the capacitor C. The current charge and discharge realizes the integration function with the capacitor C of a small capacitance value, such as 2 pF~15 pF. Thus, the analog integrator 406 can be made small in size.

Figure 7:
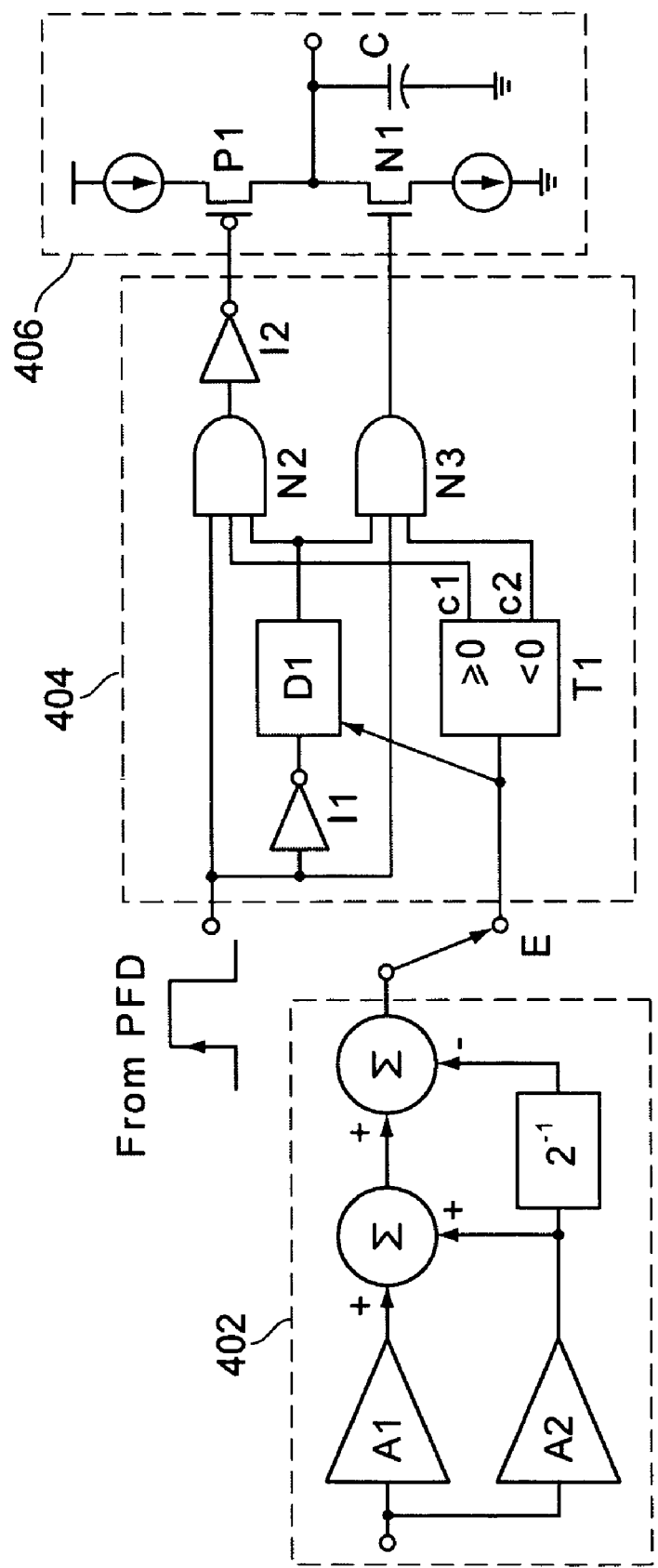
FIG. 7 illustrates a digital-to-analog converter for the mixed mode loop filter in accordance with one embodiment of the present invention.

FIG. 7 schematically illustrates the analog to digital converter 404 in detail in accordance with one embodiment of the present invention. In this embodiment, the digital-to-analog converter includes a variable delay unit D1, a controller T1, inverters I1, I2 and three input AND gates N2, N3. One input to the digital-to-analog converter 404 is a sampling pulse from the phase and frequency decoder, and another is the digital output of the digital adder 402. The pulse provides the first input to the AND gates N2, N3, the output of the inverter I1 and delay unit D1 provides the second input to the AND gates N2, N3, and the output of controller T1 provides the third input to the AND gates N2, N3. The controller T1 generates a charging signal to the AND gate N2 when the output signal from the digital adder 402 is greater than or equal to zero. The controller T1 generates a discharging signal to the AND gate N3 when the output signal from the digital adder 402 is smaller than zero. The outputs of the AND gates N1, N2 are connected to the gates of the transistors P1, N1 of the analog integrator 406. The digital charge pump 304 (shown in FIG. 3) has an infinite gain so that a low resolution digital-to-analog converter 404 (1-bit~5-bit) is sufficient to interface between the digital adder 402 and the analog integrator 406 to obtain the necessary resolution. A low resolution digital-to-analog converter 404 occupies less area.

The proposed mixed mode loop filter takes the advantages of the digital loop filter and analog loop filter and results in a PLL circuit that has high accuracy but occupies minimum area. The zero is realized using a digital adder which occupies minimum area, and the pole is realized in analog integrator with a small capacitor which occupies minimum area. A low resolution digital-to-analog converter used to interface the digital adder and analog integrator also occupies a minimum area. Thus, the mixed mode PLL circuit can be realized with a minimum area.

The following table compares the proposed mixed mode PLL circuit with the conventional analog and digital PLL circuits.

TABLE 1

Comparison of multi-mode PLL verses analog PLL and digital PLL

|  | Analog PLL Circuit | Digital PLL Circuit | Proposed Mixed mode PLL Circuit |
| --- | --- | --- | --- |
| Charge Pump | Analog | Digital | Digital |
| Loop Filter | Analog | Digital | Mixed-mode |
| DAC | — | High resolution | Low resolution |
| Capacitor | Large | — | Small |
| Accuracy | High | Low | High |
| Scaleable | No | No | Yes |
| Area | Large | Large | Small |

The above illustration provides many different embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A phase-locked loop circuit comprising:
a phase and frequency detector receiving a reference signal and an output signal of the phase-locked loop circuit for generating a detected signal representing a difference between the reference signal and the output signal in frequency or phase;
a digital charge pump coupled to the phase and frequency detector for generating a charge control signal in response to the detected signal;
a mixed mode loop filter coupled to the digital charge pump for filtering the charge control signal and generating an oscillation control signal, the mixed mode loop filter further comprises;
a digital adder coupled to the digital charge pump for digitally processing the charge control signal;
a digital-to-analog converter coupled to the digital adder, the digital-to-analog converter having a low resolution from 1 bit to 5 bits; and
a voltage controlled oscillator coupled to the mixed mode loop filter for generating the output signal of the phase-locked loop circuit by adjusting its oscillation frequency in response to the oscillation control signal,
wherein the mixed mode loop filter has both digital and analog characteristics in carrying out filtering the charge control signal, thereby reducing a layout area for the same to be implemented on a semiconductor substrate, and
wherein the digital adder further comprises:
a first amplifier coupled to the digital charge pump for generating a first signal equal to the charge control signal multiplied by a first gain;
a second amplifier coupled to the digital charge pump for generating a second signal equal to the charge control signal multiplied by a second gain;
a first adder coupled to the first and second amplifiers for summing the first and second signals to generate a third signal;
a multiplier coupled to the second amplifier for generating a fourth signal equal to the second signal multiplied by a predetermined factor; and
a second adder coupled to the first adder and the multiplier for generating an output signal of the digital adder equal to the third minus the fourth signal.

2. The phase-locked loop circuit of claim 1 wherein the digital-to-analog converter is coupled to the digital adder for converting the output signal of the digital adder into an analog signal.

3. The phase-locked loop circuit of claim 2 wherein the digital-to-analog converter further comprises:
a first inverter for inverting a sampling pulse received from the phase and frequency detector;
a delay unit coupled to the first inverter for delaying the inverted sampling pulse in response to the output signal of the digital adder;
a controller coupled to the digital adder for generating a charging signal when the output signal of the digital adder is greater than or equal to zero, and a discharging signal when the output signal of the digital adder is smaller than zero;
a first AND gate device coupled to the sampling pulse, the delay unit, and the controller for generating a first output signal of the digital-to-analog converter in response to the sampling signal, the delayed inverted sampling signal, and the charging signal;
a second AND gate device coupled to the sampling pulse, the delay unit, and the controller for generating a second output signal of the digital-to-analog converter in response to the sampling signal, the delayed inverted sampling signal, and the discharging signal; and a second inverter coupled to the first AND gate device for inverting the first output signal of the digital-to-analog converter.

4. The phase-locked loop circuit of claim 3 wherein the mixed mode loop filter comprises an analog integrator coupled to the digital-to-analog converter for generating the oscillation control signal in respond to a pulse width of the inverted first output signal and the second output signal of the digital-to-analog converter.

5. The phase-locked loop circuit of claim 4 wherein the analog integrator further comprises:
  a PMOS transistor having a source coupled to a current source, a gate coupled to the inverted first output signal of the digital-to-analog converter;
  an NMOS transistor having a source coupled to a current source, a drain coupled to a drain of the PMOS transistor, and a gate coupled to the second output signal of the digital-to-analog signal; and
  a capacitor coupled between the drains of the PMOS and NMOS transistors and ground.

6. The phase-locked loop circuit of claim 5 wherein the capacitor has capacitance between 2 pF and 15 pF.

7. A phase-locked loop circuit comprising:
  a phase and frequency detector receiving a reference signal and an output signal of the phase-locked loop circuit for generating a detected signal representing a difference between the reference signal and the output signal in frequency or phase;
  a digital charge pump coupled to the phase and frequency detector for generating a charge control signal in response to the detected signal;
  a digital adder coupled to the digital charge pump for digitally processing the charge control signal;
  a digital-to-analog converter coupled to the digital adder for converting the processed charge control signal into an analog signal, wherein the digital-to-analog converter has a low resolution from 1 bit to 5 bits;
  an analog integrator coupled to the digital-to-analog converter for generating an oscillation control signal in response to a pulse width of the analog signal; and
  a voltage controlled oscillator coupled to the analog integrator for generating the output signal of the phase-locked loop circuit by adjusting its oscillation frequency in response to the oscillation control signal, wherein the digital adder further comprises:
  a first amplifier coupled to the digital charge pump for generating a first signal equal to the charge control signal multiplied by a first gain;
  a second amplifier coupled to the digital charge pump for generating a second signal equal to the charge control signal multiplied by a second gain;
  a first adder coupled to the first and second amplifiers for summing the first and second signals to generate a third signal;
  a multiplier coupled to the second amplifier for generating a fourth signal equal to the second signal multiplied by a predetermined factor; and
  a second adder coupled to the first adder and the multiplier for generating an output signal of the digital adder equal to the third signal minus the fourth signal.

8. The phase-locked loop circuit of claim 7 wherein the digital-to-analog converter further comprises:
  a first inverter for inverting a sampling pulse received from the phase and frequency detector;
  a delay unit coupled to the first inverter for delaying the inverted sampling pulse in response to the output signal of the digital adder;
  a controller coupled to the digital adder for generating a charging signal when the output signal of the digital adder is greater than or equal to zero, and a discharging signal when the output signal of the digital adder is smaller than zero;
  a first AND gate device coupled to the sampling pulse, the delay unit, and the controller for generating a first output signal of the digital-to-analog converter in response to the sampling signal, the delayed inverted sampling signal, and the charging signal;
  a second AND gate device coupled to the sampling pulse, the delay unit, and the controller for generating a second output signal of the digital-to-analog converter in response to the sampling signal, the delayed inverted sampling signal, and the discharging signal; and
  a second inverter coupled to the first AND gate device for inverting the first output signal of the digital-to-analog converter.

9. The phase-locked loop circuit of claim 8 wherein the analog integrator further comprises:
  a PMOS transistor having a source coupled to a current source, a gate coupled to the inverted first output signal of the digital-to-analog converter;
  an NMOS transistor having a source coupled to a current source, a drain coupled to a drain of the PMOS transistor, and a gate coupled to the second output signal of the digital-to-analog signal; and
  a capacitor coupled between the drains of the PMOS and NMOS transistors and ground.

10. The phase-locked loop circuit of claim 9 wherein the capacitor has capacitance between 2 pF and 15 pF.

* * * * *